4/22/86 XR 4,584,591

United States Patent [19]

Kindler

[11] Patent Number: 4,584,591

[45] Date of Patent: Apr. 22, 1986

[54] FASTENING AND CONNECTING ARRANGEMENT FOR PIEZOELECTRIC DRIVING ELEMENTS IN THE WRITE HEADS OF INK WRITING DEVICES

[75] Inventor: Wilfried Kindler, Munich, Fed. Rep. of Germany

[73] Assignee: Siemens Aktiengesellschaft, Berlin and Munich, Fed. Rep. of Germany

[21] Appl. No.: 718,612

[22] Filed: Apr. 1, 1985

[30] Foreign Application Priority Data

May 16, 1984 [DE] Fed. Rep. of Germany ....... 3418202

[51] Int. Cl.[4] ...................... G01D 15/18; H01L 41/08

[52] U.S. Cl. ................................ 346/140 R; 310/369

[58] Field of Search ................. 346/140 PD; 310/369

[56] References Cited

U.S. PATENT DOCUMENTS

| | | | |
|---|---|---|---|
| 4,158,847 | 6/1979 | Heinzl et al. . | |
| 4,288,799 | 9/1981 | Uzawa et al. ............... | 346/140 PD |
| 4,368,477 | 1/1983 | Heinzl et al. ................ | 346/140 PD |
| 4,502,059 | 2/1985 | Blessington ................. | 346/140 PD |

FOREIGN PATENT DOCUMENTS 3234408 3/1984 Fed. Rep. of Germany .

*Primary Examiner*—George H. Miller, Jr.
*Attorney, Agent, or Firm*—Thomas H. Jackson

[57] ABSTRACT

For fastening and connecting tubular piezoelectric driving elements in the write heads of ink writing devices, contact clips are provided, arranged on a circuit board, and presented connector banks, into which the piezoelectric driving elements can be snapped. Several circuit boards can be plugged into a mother board. The mother board, equipped with circuit boards and connectors which are wave-soldered to the mother board constitute a piezo-tubular bundle.

3 Claims, 3 Drawing Figures

FASTENING AND CONNECTING ARRANGEMENT FOR PIEZOELECTRIC DRIVING ELEMENTS IN THE WRITE HEADS OF INK WRITING DEVICES

BACKGROUND OF THE INVENTION

1. Technical Field

The invention relates to the field of ink jet printers generally and, more particularly, to a fastening and connecting arrangement of tubular piezoelectric driving elements in writing heads of printers.

2. Description of the Prior Art

Write heads are known in ink writing devices which are provided with several writing nozzles in the form of ink channels for writing fluids, which in turn are shaped by hollowing out the write head according to German Pat. No. 25 43 451, which corresponds to U.S. Pat. No. 4,158,847. Ink droplets are discharged through the action of the piezoelectric elements, which cylindrically surround the ink channels over a fraction of their length, and which undergo deformation at a suitable command. This kind of arrangement makes possible the manufacture of write heads by casting the driving elements while concomitantly shaping out the ink channels. However, the strict requirements imposed by the molding of the ink channels involve considerable manufacturing input. In order to minimize this, a method is known whereby several piezoelectric driving elements are grouped into a so-called piezo-tubular bundle in accordance with German Pat. No. 32 34 408. According to the familiar procedure, the piezo-tubular bundle is introduced into a frame, and contact springs are provided for the piezoelectric driving elements which, when capped by a casing roof, close the electrical circuit to the piezo-tubular bundle. While it is true that mounting the piezo-tubular bundle directly as a so-called preassembled one-piece component represents a simplification of the production process, the precise positioning and fastening of the piezoelectric driving elements remain difficult to control and require relatively high manual skill. Furthermore, a necessary precondition for reliable contact is a strict correspondence between the position of the contact spring and that of the piezoelectric driving elements.

SUMMARY OF THE INVENTION

The object of the present invention is to develop an arrangement which improves the fastening and contact of the piezoelectric driving elements, primarily for the manufacturing of write heads with a large number of ink channels.

This task is performed by providing a circuit board for each group of piezoelectric driving elements. Each circuit board is equipped with contact clips arranged in rows which have an associate connector bond. The circuit bonds are all pluggable into a mother board.

An essential advantage of the present invention is the fact that the production of write heads can be automated and that the use of contact clips and circuit boards permits a precision mounting—in the correct position and to the correct connection—of the piezoelectric driving elements.

The invention is described below in greater detail with reference to the following figures.

DETAILED DESCRIPTION

Figure 1:
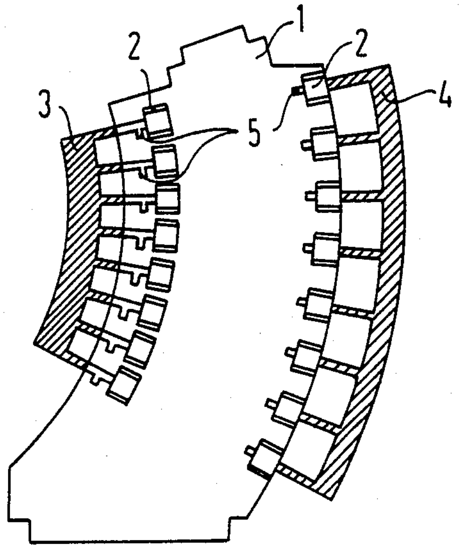
FIG. 1 shows a circuit board with contact clips and contact banks.

On the circuit board 1, represented in FIG. 1, there are two rows of contact clips 2, one on either side of the circuit board 1; the contacts are arranged in pairs as supporting and connecting elements for the piezoelectric driving elements (piezoelectric tubes). Contacts 2 are connected to contact banks 3,4 located on either side of circuit board 1 by a familiar method such as wave soldering. Each of the two contact banks 3,4 has a connecting strip, which is mechanically removed (e.g., by cutting) after soldering. In FIG. 1 these external disposable portions of contact banks 3 and 4 are hatched. Cutting away these portions means that contact clips 2 are individually freed. Each contact clip 2 presents a small nipple 5 through which the contact is established with the circuits (not represented here) on the circuit board 1, and, implicitly, with the inside and outside electrodes of each inserted piezoelectric tube.

Figure 2:
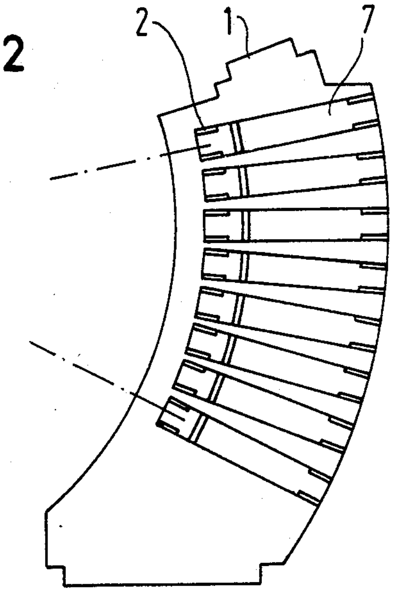
FIG. 2 shows the circuit board of FIG. 1, equipped with piezoelectric driving elements.

As shown in FIG. 2, the piezoelectric tubes 7 are individually snapped into contact clips 2, a procedure that ensures a very safe support for, and fastening grip on, the piezoelectric tubes. Thereby, a very reliable connection results between the circuits on the circuit board 1 (which connections are not represented here) and the inside and outside electrodes of the piezoelectric tubes 7, more specifically: the outside electrode of each piezoelectric tube 7 is connected to one member of a connector-pair, while the inside electrode—which, as is known, protrudes over the frontal face of the piezoelectric tube—is connected to the other member of the pair. In the example in FIG. 2, each thus preassembled circuit board 1 is equipped with a row of eight piezoelectric tubes 7, whose positions, both relative to each other and to the general grouping in a write head, are precisely established.

Figure 3:
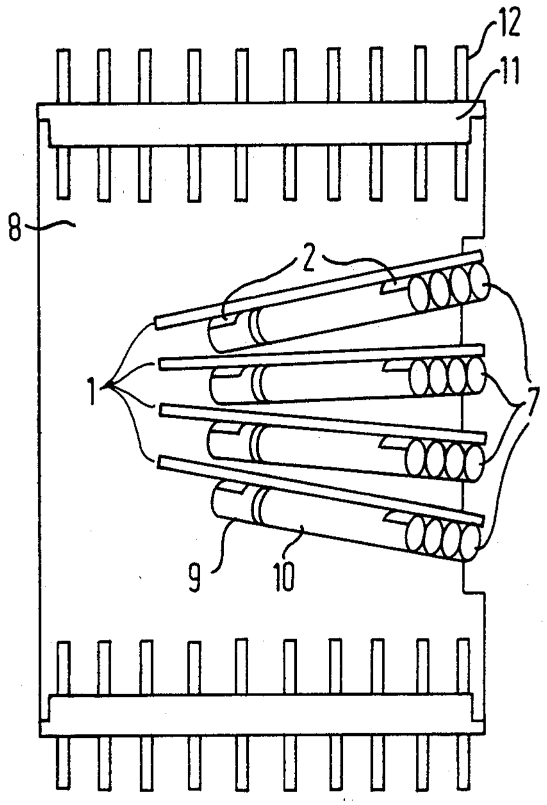
FIG. 3 shows a mother board with plugged-in printed circuit board assemblies.

The preassembled circuit boards 1 are then plugged into the respective supporting and fastening slits of the mother board 8, as shown in FIG. 3. In this design model, four circuit boards 1 are plugged into the mother board 8; the model represents, thus, a possible way of assembling a 32-nozzle write head for an ink jet printer. FIG. 3 shows also that contact clips 2 of circuit board 1 embrace each piezoelectric tube 7, both supporting and electrically linking it to the circuits. More specifically, one connector links the inside of electrode 9 of tube 7, while the other links the outside electrode 10. In addition, the mother board 8 is equipped on one side or both sides with connector strips 11, presenting outside-pointing connector pins 12, to which are attached the guides to the driving circuits. After plugging the circuit boards 1 and the connector strips 11 into the mother board 8, the assembly is wave soldered.

Bundles of piezoelectric tubes 7, preassembled as described above, are correctly positioned and connected to the mother board, as per the corresponding disposition of circuit boards 1 and contact clips 2. This procedure substantially facilitates the introduction of casting pins (not represented here). As is known, these are inserted through the piezoelectric tubes 7 and are guided basically through the alignment of the tubes. The assembly, equipped with casting pins, is finally introduced into a casting mold, where regular or injection casting is performed, whereby the casting pins shape out the ink channels of the write heads.

What is claimed is:

1. A fastening and connecting arrangement of tubular piezoelectric driving elements in the write heads of ink writing devices, comprising, for each group of piezoelectric driving elements, a circuit board, equipped with contact clips disposed in two rows along two opposite borders of the circuit plate, in numbers corresponding to that of the piezoelectric driving elements of the group, the circuit board designed to hold the piezoelectric elements, each row of contact clips being associated with a connector bank whose connecting web is disposable, and a mother board into which several circuit boards equipped with piezoelectric driving elements are plugged.

2. An arrangement according to claim 1, the contract clips having a shape permitting the piezoelectric driving elements to snap into place.

3. An arrangement according to claim 1 or 2, the mother board being equipped with connector strips and, after assembly into a structure comprising a full piezotubular bundle, being molded by regular or injection casting.

* * * * *